United States Patent
Komura (10) Patent No.: US 10,998,493 B2
(45) Date of Patent: May 4, 2021

(54) SPIN-ORBIT-TORQUE MAGNETORESISTANCE EFFECT ELEMENT AND MAGNETIC MEMORY

(71) Applicant: TDK CORPORATION, Tokyo (JP)

(72) Inventor: Eiji Komura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/578,897

(22) Filed: Sep. 23, 2019

(65) Prior Publication Data

US 2020/0106004 A1    Apr. 2, 2020

(30) Foreign Application Priority Data

Sep. 28, 2018  (JP) .............................. JP2018-184456

(51) Int. Cl.
  *G11C 11/16*   (2006.01)
  *H01L 43/08*   (2006.01)
  (Continued)

(52) U.S. Cl.
  CPC ............ *H01L 43/08* (2013.01); *G11C 11/161* (2013.01); *H01L 43/065* (2013.01); *H01L 43/10* (2013.01)

(58) Field of Classification Search
  CPC ....... H01L 43/08; H01L 43/065; H01L 43/10; G11C 11/16; G11C 11/161
  (Continued)

(56) References Cited

U.S. PATENT DOCUMENTS 8,350,347 B2   1/2013 Gaudin et al.
2004/0233584 A1  11/2004 Liu et al.
(Continued)

FOREIGN PATENT DOCUMENTS

JP   2004-349708 A   12/2004
JP   5720681 B2   5/2015
(Continued)

OTHER PUBLICATIONS

S. Fukami et al; "A spin-orbit torque switching scheme with collinear magnetic easy axis and current configuration;" nature nanotechnology; Mar. 21, 2016; pp. 1-6.
(Continued)

*Primary Examiner* — Alfredo Barmudez Lozada
(74) *Attorney, Agent, or Firm* — Oliff PLC (57) ABSTRACT

A spin-orbit-torque magnetoresistance effect element of the present invention includes: a functional unit, a first ferromagnetic layer whose magnetization direction is configured to be fixed, a second ferromagnetic layer whose magnetization direction is configured to change, and a non-magnetic layer located between the first ferromagnetic layer and the second ferromagnetic layer being laminated therein; a spin-orbit torque wiring which extends in a first direction which intersects a lamination direction of the functional unit and is joined to the second ferromagnetic layer; a heat sink layer which extends in the first direction, is disposed so that the heat sink layer and the spin-orbit torque wiring at least partially overlap when viewed in a plan view from the lamination direction, and is provided spaced from the spin-orbit torque wiring in the lamination direction by a distance of twice a thickness of the functional unit or less in the lamination direction thereof.

11 Claims, 4 Drawing Sheets

(51) Int. Cl.
*H01L 43/10* (2006.01)
*H01L 43/06* (2006.01)

(58) Field of Classification Search
USPC .......................................................... 365/158
See application file for complete search history.

(56) References Cited

U.S. PATENT DOCUMENTS

| | | |
|---|---|---|
| 2010/0149862 A1 | 6/2010 | Ishiwata et al. |
| 2013/0094284 A1* | 4/2013 | Ohno ..................... H01L 43/10 |
| | | 365/158 |
| 2015/0348606 A1 | 12/2015 | Buhrman et al. |
| 2017/0222135 A1 | 8/2017 | Fukami et al. |
| 2018/0205004 A1 | 7/2018 | Park et al. |

FOREIGN PATENT DOCUMENTS

| | | |
|---|---|---|
| WO | 2007/119708 A1 | 10/2007 |
| WO | 2016/021468 A1 | 2/2016 |

OTHER PUBLICATIONS

Y. K. Kato et al; "Observation of the Spin Hall Effect in Semiconductors;" Science; Dec. 10, 2004; pp. 1910-1913; vol. 306.

I.M. Miron et al; "Perpendicular switching of a single ferromagnetic layer induced by in-plane current injection;" Nature; Aug. 11, 2011; pp. 189-193; vol. 476.

L. Liu et al; "Spin torque switching with the giant spin Hall effect of tantalum;" Mar. 13, 2012; pp. 1-19 and 1-12.

L. Liu et al; "Current-Induced Switching or Perpendicularly Magnetized Magnetic Layers Using Spin Torque from the Spin Hall Effect;" Physical Review Letters; Aug. 29, 2012; vol. 109; pp. 096602-1-096602-5.

KS. Lee et al; "Threshold current for switching of a perpendicular magnetic layer induced by spin hall effect"; Applied Physics Letters; vol. 102; Oct. 12, 2012; pp. 1-17.

KS. Lee et al; "Thermally activated switching of perpendicular magnet by spin-orbit spin torque."; Applies Physics Letter; vol. 104; Feb. 21, 2014; pp. 072413-1-072413-5.

S. Fukami et al; "Magnetization switching by spin-orbit torque in an antiferromagnet-ferromagnet bilayer system;" Nature Materials; Feb. 15, 2016; vol. 15; pp. 535-541.

S. Takahashi et al; "Spin injection and detection in magnetic nanostructures;" Physical Review; vol. 67; Feb. 28, 2003; pp. 052409-1-052409-4.

Y. Seo et al; "Area-Efficient SOT-MRAM With a Schottky Diode;" IEEE Electron Device Letters; Aug. 2016; vol. 37 No. 8; pp. 982-985.

\* cited by examiner

SPIN-ORBIT-TORQUE MAGNETORESISTANCE EFFECT ELEMENT AND MAGNETIC MEMORY

CROSS-REFERENCE TO RELATED APPLICATION

Priority is claimed on Japanese Patent Application No. 2018-184456, filed Sep. 28, 2018, the content of which is incorporated herein by reference.

BACKGROUND OF THE INVENTION

Field of the Invention

The present invention relates to a spin-orbit-torque magnetoresistance effect element and a magnetic memory.

Description of Related Art

Giant magnetoresistance (GMR) elements formed of multilayer films including ferromagnetic layers and non-magnetic layers, and tunneling magnetoresistance (TMR) elements using insulating layers (tunnel barrier layers and barrier layers) as non-magnetic layers are known as a magnetoresistance effect element. Generally, TMR elements have element resistances and magnetoresistance (MR) ratios higher than those of GMR elements. For this reason, TMR elements have attracted attention as elements for magnetic sensors, high frequency components, magnetic heads, and nonvolatile random access memories (MRAMs).

In an MRAM, data is read and written using characteristics in which an element resistance of a TMR element changes when magnetization directions of two ferromagnetic layers sandwiching an insulating layer change. As writing methods for MRAMs, a method in which writing (magnetization reversal) is performed using a magnetic field produced by a current and a method in which writing (magnetization reversal) is performed using a spin transfer torque (STT) occurring when a current flows in a lamination direction of a magnetoresistance effect element are known. It is considered that magnetization reversals of TMR elements using an STT are efficient in view of energy efficiency, but a reversal current density causing magnetization reversal to be performed is high. In terms of a long life of TMR elements, it is desirable that reversal current densities be low. This applies to GMR elements.

Therefore, in recent years, magnetization reversal using a pure spin current generated due a spin Hall effect which is a mechanism different from an STT and serves as a means for reducing an inversion current has been attracting attention (for example, Non-Patent Document 1). A pure spin current generated due to a spin Hall effect induces a spin-orbit torque (SOT) and magnetization reversal occurs due to the SOT. Alternatively, even in the case of a pure spin current generated due to an interface Rashba effect at an interface between different materials, magnetization reversal is caused due to the same SOT. A pure spin current is generated when the number of electrons with an upward spin is the same as the number of electrons with a downward spin and the electrons with an upward spin and the electrons with a downward spin flow in opposite directions and flows of charges cancel each other out. For this reason, the current flowing through a magnetoresistance effect element is zero and realization of a magnetoresistance effect element with a small reversal current density would be expected.

PATENT DOCUMENT

[Non-Patent Document 1] S. Fukami, T. Anekawa, C. Zhang and H. Ohno, Nature Nano Tech (2016). DOI: 10.1038/NNANO.2016.29

SUMMARY OF THE INVENTION

Figure 8:
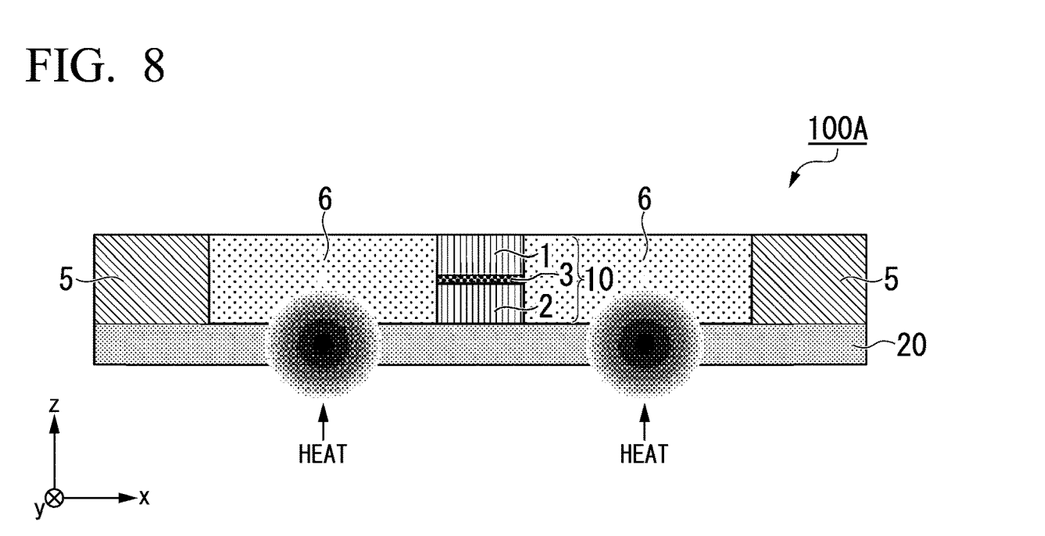
FIG. 8 is a schematic cross-sectional view of an example of a magnetoresistance effect element using magnetization reversal due to an SOT taken in a longitudinal direction of a spin-orbit torque wiring.

FIG. 8 shows a schematic cross-sectional view of an example of a magnetoresistance effect element using magnetization reversal due to an SOT taken by cutting in a longitudinal direction of a spin-orbit torque wiring.

A magnetoresistance effect element 100A shown in FIG. 8 includes a functional unit 10 which includes a magnetization fixed layer 1, a magnetization free layer 2, and a non-magnetic layer 3 disposed between these layers and a spin-orbit torque wiring (an SOT wiring) 20. Reference numeral 5 is a via and reference numeral 6 is an interlayer insulating layer. The functional unit corresponds to an MTJ when the non-magnetic layer is a tunnel barrier.

In the magnetoresistance effect element using the magnetization reversal due to the SOT as shown in FIG. 8, when a current flows in the SOT wiring, Joule heat is generated, but the SOT wiring is thin (about 3 to 5 nm in a standard example) and is surrounded by a dielectric. Thus, the generated heat is trapped in the functional unit and a place far from the via.

In the magnetoresistance effect element using the magnetization reversal due to the SOT, under the present circumstances, it is necessary to flow a large current through the SOT wiring for the purpose of magnetization reversal. Thus, dissolution of the SOT wiring due to Joule heat and disconnection due to electromigration become problems.

An object of the present disclosure is to provide a spin-orbit-torque magnetoresistance effect element in which dissipation of the heat generated in a spin-orbit torque wiring is improved and a magnetic memory which includes a plurality of spin-orbit-torque magnetoresistance effect elements.

The present disclosure provides the following means to accomplish the above object.

(1) A spin-orbit-torque magnetoresistance effect element according to a first aspect of the present disclosure includes: a functional unit, a first ferromagnetic layer whose magnetization direction is configured to be fixed, a second ferromagnetic layer whose magnetization direction is configured to change, and a non-magnetic layer located between the first ferromagnetic layer and the second ferromagnetic layer being laminated therein; a spin-orbit torque wiring which extends in a first direction which intersects a lamination direction of the functional unit and is joined to the second ferromagnetic layer; and a heat sink layer which extends in the first direction, is disposed so that the heat sink layer and the spin-orbit torque wiring at least partially overlap when viewed in a plan view from the lamination direction, and is provided spaced from the spin-orbit torque wiring in the lamination direction by a distance of twice a thickness of the functional unit or less in the lamination direction thereof.

(2) In the spin-orbit-torque magnetoresistance effect element disclosed in (1), a relationship of $T<L_{V-M}/2$ is satisfied between the distance T and the distance $L_{V-M}$, T being a distance between the spin-orbit torque wiring and the heat sink layer in the lamination direction and $L_{V-M}$ being an in-plane distance between a via connected to the spin-orbit torque wiring and the functional unit orthogonal to the lamination direction.

(3) In the spin-orbit-torque magnetoresistance effect element disclosed in (1) or (2), the heat sink layer may be joined to a surface of the first ferromagnetic layer opposite to a surface thereof joined to the non-magnetic layer.

(4) In the spin-orbit-torque magnetoresistance effect element disclosed in any one of (1) to (3), the heat sink layer may be disposed on an opposite side to a side at which the functional unit is disposed with the spin-orbit torque wiring disposed therebetween.

(5) In the spin-orbit-torque magnetoresistance effect element disclosed in any one of (1) to (4), a side heat sink layer which extends in the lamination direction, is connected to the heat sink layer, and is disposed so that the side heat sink layer and the spin-orbit torque wiring at least partially overlap when viewed in a plan view from a direction parallel to a surface orthogonal to the lamination direction may be provided.

(6) In the spin-orbit-torque magnetoresistance effect element disclosed in (5), a distance between the side heat sink layer and the spin-orbit torque wiring in a direction parallel to a surface orthogonal to the lamination direction thereof may be smaller than a distance between the spin-orbit torque wiring and the heat sink layer in the lamination direction thereof.

(7) In the spin-orbit-torque magnetoresistance effect element disclosed in (5) or (6), a material of the side heat sink layer may contain at least one selected from the group consisting of Ta, NiCr, Ti, SiN, TiN, ferrite, Ni, and Fe.

(8) In the spin-orbit-torque magnetoresistance effect element disclosed in any one of (5) to (7), a material of a layer disposed between the side heat sink layer and the spin-orbit torque wiring may be an oxide or a nitride which contains at least one selected from the group consisting of Si, Ta, Al, Mg, Si, and Ti.

(9) In the spin-orbit-torque magnetoresistance effect element disclosed in any one of (1) to (8), a material of the heat sink layer may contain at least one selected from the group consisting of Ta, NiCr, Ti, SiN, TiN, ferrite, Ni, and Fe.

(10) In the spin-orbit-torque magnetoresistance effect element disclosed in any one of (1) to (9), a material of a layer disposed between the side heat sink layer and the spin-orbit torque wiring may be an oxide or a nitride which contains at least one selected from the group consisting of Si, Ta, Al, Mg, Si, and Ti.

(11) A magnetic memory according to a second aspect of the present disclosure includes: a plurality of the spin-orbit-torque magnetoresistance effect elements according to any one of (1) to (10).

According to a spin-orbit-torque magnetoresistance effect element of the present disclosure, it is possible to provide a spin-orbit-torque magnetoresistance effect element in which dissipation of the heat generated in a spin-orbit torque wiring is improved.

DETAILED DESCRIPTION OF THE INVENTION

The present disclosure will be described in detail below with reference to the drawings as appropriate. In the drawings used in the following description, in order to facilitate the understanding of the features of the present disclosure, the characteristic parts are shown in an enlarged manner for the sake of convenience in some cases. In addition, dimensional ratios of respective constituent elements may be different from the actual ratios in some cases. Materials, dimensions, and the like exemplified in the following description are merely examples, the present disclosure is not limited thereto, and it is possible to realize the present disclosure by appropriately performing modification within a range in which the gist thereof is not changed. In the element of the present disclosure, other layers may be provided as long as the effects of the present disclosure are exhibited.

(Spin-Orbit-Torque Magnetoresistance Effect Element)

First Embodiment

Figure 1:
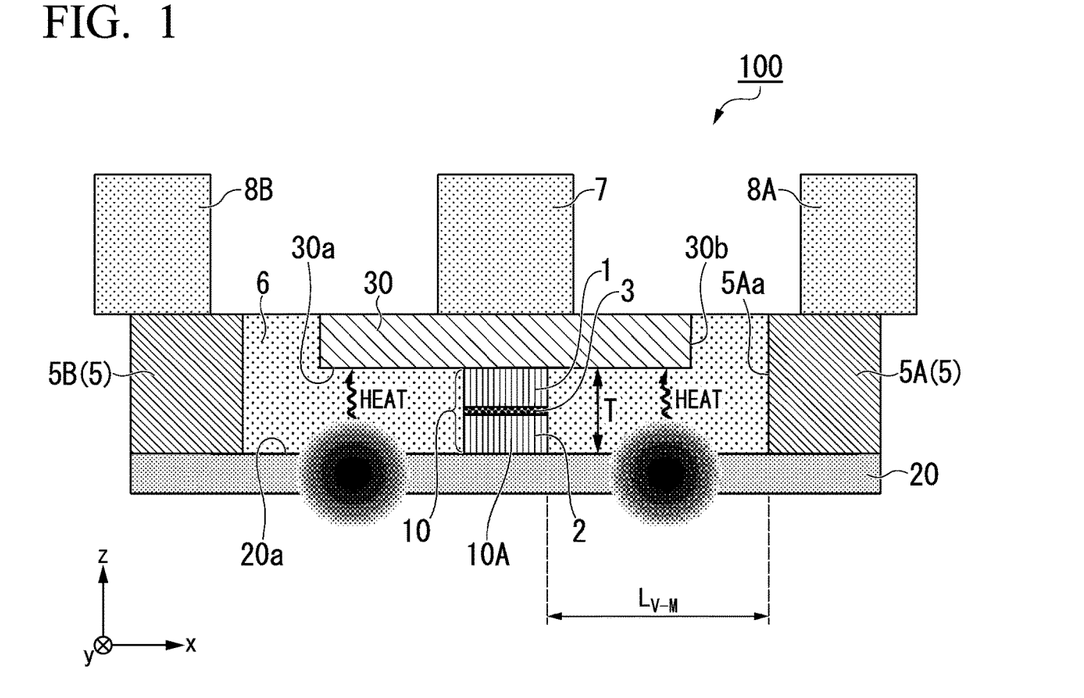
FIG. 1 is a schematic cross-sectional view taken by cutting in a direction in which a spin-orbit torque wiring extends in an example of a spin-orbit-torque magnetoresistance effect element according to a first embodiment.
Figure 2:
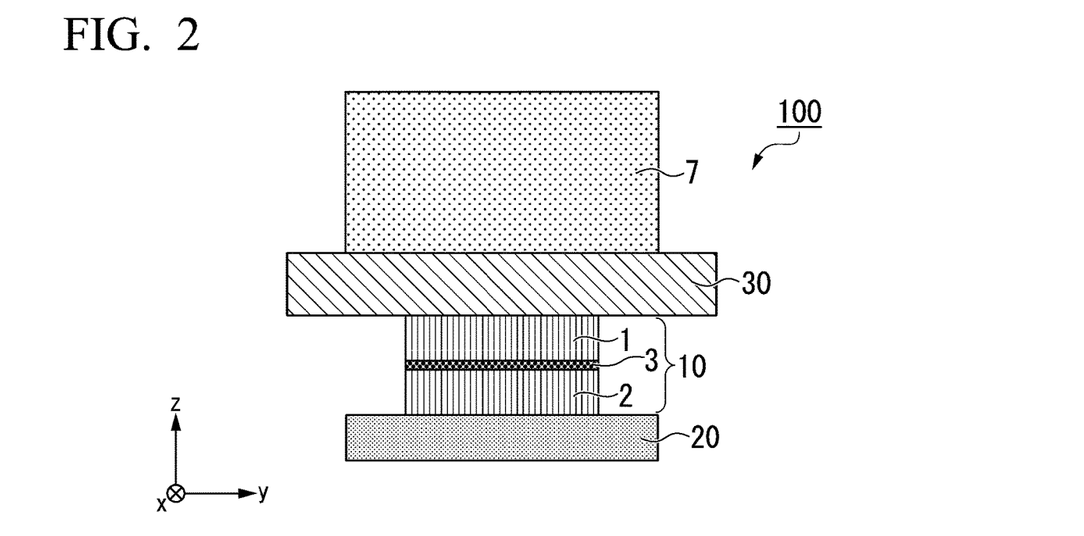
FIG. 2 is a schematic cross-sectional view of the spin-orbit-torque magnetoresistance effect element shown in FIG. 1 taken along a plane orthogonal to an extending direction of a spin-orbit torque.

FIG. 1 is a schematic cross-sectional view of an example of a spin-orbit-torque magnetoresistance effect element according to a first embodiment taken in an extending direction of spin-orbit torque. FIG. 2 is a schematic cross-sectional view of the spin-orbit-torque magnetoresistance effect element shown in FIG. 1 taken along a plane orthogonal to the extending direction of the spin-orbit torque. It should be noted that, in FIG. 2, an interlayer insulating layer 6 is not shown.

A spin-orbit-torque magnetoresistance effect element 100 shown in FIG. 1 includes a functional unit 10, a first ferromagnetic layer 1 whose magnetization direction is configured to be fixed, a second ferromagnetic layer 2 whose magnetization direction is configured to change, and a non-magnetic layer 3 located between the first ferromagnetic layer 1 and the second ferromagnetic layer 2 being laminated therein, a spin-orbit torque wiring 20 which extends in a first direction which intersects a lamination direction of the functional unit 10 and is joined to the second ferromagnetic layer 2, and a heat sink layer 30 which extends in the first direction, is disposed so that the heat sink layer and the spin-orbit torque wiring 20 at least partially overlap when viewed in a plan view from the lamination direction, and is provided spaced from the spin-orbit torque wiring 20 in the lamination direction by a distance of twice a thickness of the functional unit 10 or less in the lamination direction thereof.

The heat sink layer 30 is provided to dissipate the heat generated in the spin-orbit torque wiring 20. Therefore, it is desirable that the heat sink layer 30 be close to the spin-orbit torque wiring 20. The thickness of the functional unit 10 in the lamination direction thereof is 20 nm to 60 nm in many cases, and when the thickness of the heat sink layer 30 exceeds twice this thickness, the heat dissipation effect is not sufficient.

Although it can be said that it is desirable that the heat sink layer 30 be close to the spin-orbit torque wiring 20, as will be described below, there is also a limit to proximity in terms of aspects other than heat dissipation. That is to say, when the heat sink layer 30 is disposed on the functional unit 10 side with respect to the spin-orbit torque wiring 20, a state in which the heat sink layer 30 is joined to an upper surface of a second ferromagnetic layer corresponds to a closest disposition state. In this case, a separation distance between the heat sink layer 30 and the spin-orbit torque wiring 20 is the same as the thickness of the functional unit 10 in the lamination direction thereof. On the other hand, when the heat sink layer 30 is formed before the spin-orbit torque wiring 20 (refer to FIG. 5), there is a limit to proximity for securing the flatness, the proximity depends on a material to be used, and it is conceivable that a lower limit be about 20 nm to 50 nm.

In FIG. 1, reference numeral 7 denotes an electrode for reading and writing data. The electrode 7 is electrically connected to the functional unit 10 on an opposite side to the spin-orbit torque wiring 20. Furthermore, reference numerals 8A and 8B denote electrodes for flowing a current to the spin-orbit torque wiring 20.

Hereinafter, a first direction which is a direction perpendicular to a surface of the first ferromagnetic layer 1 is assumed to be a z direction, a second direction which is orthogonal to the first direction and in which the spin-orbit torque wiring 20 extends is assumed to be an x direction, and a direction orthogonal to both of the x direction and the z direction is assumed to be a y direction.

[Functional Unit]

The functional unit 10 functions in the same manner as in a normal magnetoresistance effect element. The first ferromagnetic layer 1 is referred to as a magnetization fixed layer or a reference layer and the second ferromagnetic layer 2 is referred to as a magnetization free layer, a storage layer, or the like.

In the functional unit 10, the magnetization of the first ferromagnetic layer 1 is more difficult to move than the magnetization of the second ferromagnetic layer 2 and is fixed in one direction under a predetermined magnetic field environment. The magnetization direction of the second ferromagnetic layer 2 changes relative to the magnetization direction of the first ferromagnetic layer 1 to function as the functional unit 10. In the case of being applied to a coercivity-differing type (a pseudo spin valve type) MRAM, the coercivity of the first ferromagnetic layer 1 is set larger than the coercivity of the second ferromagnetic layer 2. In the case of being applied to an exchange bias type (a spin valve type) MRAM, the magnetization of the first ferromagnetic layer 1 is fixed through exchange coupling with an antiferromagnetic layer.

The functional unit 10 may include layers other than the first ferromagnetic layer 1, the second ferromagnetic layer 2, and the non-magnetic layer 3. For example, an antiferromagnetic layer for fixing the magnetization direction of the first ferromagnetic layer 1, an underlayer for enhancing the crystallinity of the functional unit 10, and the like may be exemplified.

The first ferromagnetic layer 1 is made of a ferromagnetic material. It is desirable that the first ferromagnetic layer 1 be made of a high spin polarization material such as Fe, Co, Ni, an alloy of Ni and Fe, an alloy of Fe and Co, and an alloy of Fe, Co, and B. By using these materials, a rate of change in magnetoresistance of the functional unit 10 increases. Furthermore, the first ferromagnetic layer 1 may be made of a Heusler alloy. A film thickness of the first ferromagnetic layer 1 is preferably 1 to 20 nm.

A method for fixing the magnetization of the first ferromagnetic layer 1 is not particularly limited. For example, an antiferromagnetic layer may be added to be in contact with the first ferromagnetic layer 1 so as to fix the magnetization of the first ferromagnetic layer 1. Furthermore, the magnetization of the first ferromagnetic layer 1 may be fixed using the magnetic anisotropy caused due to a crystal structure, a shape, and the like. FeO, CoO, NiO, $CuFeS_2$, IrMn, FeMn, PtMn, Cr, Mn, or the like can be used for the antiferromagnetic layer.

The second ferromagnetic layer 2 is made of a ferromagnetic material whose direction of magnetization can be changed using an externally applied magnetic field or spin-polarized electrons.

As materials of the second ferromagnetic layer 2, CoFe, CoFeB, CoFeSi, CoMnGe, CoMnSi, CoMnAl, FeB, Co, a CoCr-based alloy, a Co multilayer film, a CoCrPt-based alloy, a FePt-based alloy, a SmCo-based alloy containing a rare earth, a TbFeCo alloy, or the like can be used. Furthermore, the second ferromagnetic layer 2 may be made of a Heusler alloy.

A thickness of the second ferromagnetic layer 2 is preferably about 0.5 to 20 nm. Furthermore, a high spin polarization material may be inserted between the second ferromagnetic layer 2 and the non-magnetic layer 3. By inserting the high spin polarization material, it is possible to obtain a high rate of change in magnetoresistance.

As the high spin polarization material, a CoFe alloy, a CoFeB alloy, or the like may be exemplified. A film thickness of the CoFe alloy or the CoFeB alloy is preferably about 0.2 to 1.0 nm.

The non-magnetic layer 3 is a layer disposed between the first ferromagnetic layer 1 and the second ferromagnetic layer 2. The non-magnetic layer 3 is composed of a layer made of a conductor, an insulator, or a semiconductor or a layer including a conductive point formed of a conductor in an insulator. It is desirable that the non-magnetic layer 3 be a non-magnetic layer.

For example, when the non-magnetic layer 3 is made of an insulator, the functional unit 10 serves as a tunneling magnetoresistance (TMR) effect element, and when the non-magnetic layer 3 is made of a metal, the functional unit 10 serves as a giant magnetoresistance (GMR) effect element.

When an insulating material is applied as the non-magnetic layer 3, an insulating material such as $Al_2O_3$, MgO, or $MgAl_2O_4$ can be used. By adjusting a film thickness of the non-magnetic layer 3 so that a coherent tunnel effect appears between the first ferromagnetic layer 1 and the second ferromagnetic layer 2, a high rate of change in magnetoresistance can be obtained. In order to use the TMR effect efficiently, the film thickness of the non-magnetic layer 3 is preferably about 0.5 to 3.0 nm.

When the non-magnetic layer 3 is made of a conductive material, a conductive material such as Cu, Ag, Au, or Ru can be used. In order to use the GMR effect efficiently, the film thickness of the non-magnetic layer 3 is preferably about 0.5 to 3.0 nm.

When the non-magnetic layer 3 is made of a semiconductor material, a material such as ZnO, $In_2O_3$, $SnO_2$, ITO, GaOx, or $Ga_2O_x$ can be used. In this case, the film thickness of the non-magnetic layer 3 is preferably about 1.0 to 4.0 nm.

When a layer including a conductive point made of a conductor in a non-magnetic insulator is applied as the non-magnetic layer 3, it is desirable that a structure in which a conductive point formed of a conductor such as CoFe, CoFeB, CoFeSi, CoMnGe, CoMnSi, CoMnAl, Fe, Co, Au, Cu, Al, or Mg is included in a non-magnetic insulator formed of $Al_2O_3$, MgO, or the like be provided. In this case, the film thickness of the non-magnetic layer 3 is preferably about 0.5 to 2.0 nm.

[Spin-Orbit Torque Wiring]

The spin-orbit torque wiring 20 extends in the x direction. The spin-orbit torque wiring 20 is connected to one surface of the second ferromagnetic layer 2. The spin-orbit torque wiring 20 may be directly connected to the second ferromagnetic layer 2 or may be connected to the second ferromagnetic layer 2 with another layer therebetween.

The spin-orbit torque wiring 20 generates a spin current due to a spin Hall effect when a current flows therethrough. A spin Hall effect is a phenomenon in which, when a current flows through a wiring, a spin current is induced in a direction orthogonal to a direction in which the current flows on the basis of a spin-orbit interaction. A mechanism due to which a spin current is generated due to a spin Hall effect will be described.

Figure 3:
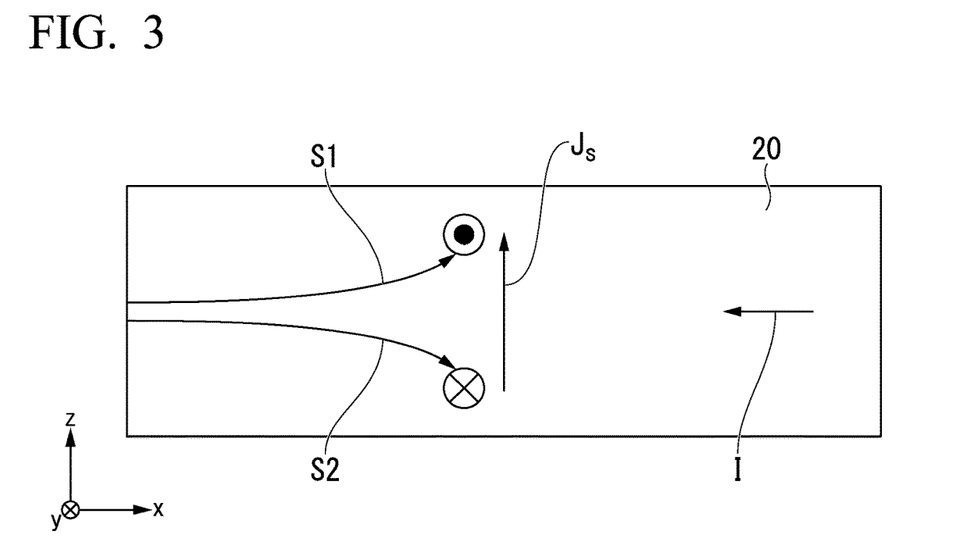
FIG. 3 is a schematic diagram showing a spin Hall effect.

As shown in FIG. 3, when a potential difference is applied to both ends of the spin-orbit torque wiring 20 in the x direction, a current I flows in the x direction. When the current I flows, first spins S1 oriented in the y direction and second spins S2 oriented in a -y direction are bent in a direction orthogonal to the current. A normal Hall effect and a spin Hall effect are the same in that a moving (traveling) direction of moving (traveling) charges (electrons) is bent. On the other hand, a normal Hall effect and a spin Hall effect significantly differ in that, in a normal Hall effect, charged particles moving in a magnetic field are subjected to a Lorentz force and thus a moving direction of the charged particles is bent, whereas in a spin Hall effect, as long as electrons travel (a current flows) even when no magnetic field is present, a traveling direction thereof is bent.

The number of electrons with the first spin S1 and the number of electrons with the second spin S2 are the same in a non-magnetic material (a material which is not a ferromagnetic material). Thus, the number of electrons with the first spin S1 directed upward is equal to the number of electrons with the second spin S2 directed downward in the drawings. For this reason, a current which is a net flow of charges is zero. A spin current which does not involve this current is particularly referred to as a pure spin current.

Here, if an electron flow of the first spin S1 is represented by $J_\uparrow$, an electron flow of the second spin S2 is represented by $J_\downarrow$, and a spin current is represented by $J_S$, $J_S=J_\uparrow-J_\downarrow$ is defined. The spin current $J_S$ flows in the z direction in the drawings. In FIG. 1, the second ferromagnetic layer 2 is present on an upper surface of the spin-orbit torque wiring 20. For this reason, spins are injected into the second ferromagnetic layer 2.

The spin-orbit torque wiring 20 is made of any of a metal, an alloy, an intermetallic compound, a metal boride, a metal carbide, a metal silicide, and a metal phosphide having a function of generating a spin current due to a spin Hall effect when a current flows.

It is desirable that main constituent elements of the spin-orbit torque wiring 20 be non-magnetic heavy metals. Here, heavy metals refer to metals having specific gravities greater than or equal to that of yttrium. It is desirable that non-magnetic heavy metals be non-magnetic metals having d electrons or f electrons in the outermost shell and having high atomic numbers of 39 or higher. These non-magnetic metals have a large spin-orbit interaction which causes a spin Hall effect.

Electrons generally move in a direction opposite to that of a current regardless of their spin orientation. On the other hand, non-magnetic metals having high atomic numbers and having d electrons or f electrons in the outermost shell have a large spin-orbit interaction and a spin Hall effect acts strongly. For this reason, a moving direction of electrons depends on the orientation of electron spins. Therefore, a spin current $J_S$ is easily generated in these non-magnetic heavy metals.

Also, the spin-orbit torque wiring 20 may contain a magnetic metal. Magnetic metals refer to ferromagnetic metals or antiferromagnetic metals. When a non-magnetic metal contains a small amount of a magnetic metal, this serves to scatter spins. When spins scatter, a spin-orbit interaction increases and the generation efficiency of a spin current with respect to a current increases.

On the other hand, when an amount of magnetic metal to be added is excessively increased, the generated spin current may scatter due to the added magnetic metal, and as a result, the effect of decreasing a spin current becomes stronger in some cases. For this reason, it is desirable that a molar ratio of a magnetic metal to be added be sufficiently smaller than a total of molar ratios of elements constituting a spin-orbit torque wiring. The molar ratio of the magnetic metal to be added is preferably 3% or less of the total molar ratios.

The spin-orbit torque wiring 20 may contain a topological insulator. A topological insulator is a substance in which the inside of the substance is an insulator or a high resistance material and a spin-polarized metal state occurs on a surface thereof. An internal magnetic field is generated in this substance due to a spin-orbit interaction. Thus, even when there is no external magnetic field, a new topological phase appears due to the effect of the spin-orbit interaction. This is a topological insulator and a pure spin current can be generated with high efficiency due to a strong spin-orbit interaction and the breakage of reversal symmetry at an edge.

Examples of preferred topological insulators include SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, and the like. These topological insulators can generate a spin current with high efficiency.

[Heat Sink Layer]

The heat sink layer 30 extends in the x direction as in an extending direction of the spin-orbit torque wiring 20, is disposed so that the heat sink layer 30 and the spin-orbit torque wiring 20 at least partially overlap when viewed in a plan view from the z direction which is the lamination direction of the functional unit 10, and is provided at the same distance as the thickness of the functional unit 10 in the lamination direction thereof from an upper surface 20a of the spin-orbit torque wiring 20 in the z direction. In the example shown in FIG. 1, the heat sink layer 30 is configured to be joined to an upper surface of a first ferromagnetic layer in the functional unit 10 and a separation distance T between the heat sink layer 30 and the spin-orbit torque wiring 20 is equal to the thickness of the functional unit 10.

Here, the distance T between the spin-orbit torque wiring 20 and the heat sink layer 30 refers to the distance between facing surfaces of the spin-orbit torque wiring 20 and the heat sink layer 30 in the z direction which is the lamination direction of the functional unit 10. In the example shown in FIG. 1, the distance T is a distance between the upper surface 20a of the spin-orbit torque wiring 20 and a lower surface 30a of the heat sink layer 30.

Since the heat sink layer 30 extends in the same direction as the spin-orbit torque wiring 20, the heat generated in the spin-orbit torque wiring 20 can easily dissipate to the heat sink layer 30.

It is desirable that a state in which the heat sink layer 30 and the spin-orbit torque wiring 20 overlap when viewed in a plan view from the z direction be a state in which the heat sink layer 30 and the spin-orbit torque wiring 20 overlap so that the heat sink layer 30 covers the spin-orbit torque wiring 20 in the y direction (a width direction) orthogonal to the extending direction thereof in view of heat dissipation properties.

In the example shown in FIG. 1, when an in-plane distance between a via 5 connected to the spin-orbit torque wiring 20 and the functional unit 10 orthogonal to the lamination direction (the z direction) is set to be $L_{V-M}$, it is desirable to have a relationship of $T<L_{V-M}/2$ between the distance $L_{V-M}$ and the distance T.

Here, the in-plane distance $L_{V-M}$ between the via 5 and the functional unit 10 orthogonal to the lamination direction (the z direction) refers to a distance between a side surface 5Aa of the via 5A and a side surface 10A of the functional unit 10 in a case in which description is provided with reference to FIG. 1 when a side surface of the via and a side surface of the functional unit stand perpendicularly upright to the upper surface 20a of the spin-orbit torque wiring 20. When one or both of the side surface 5Aa of the via 5A and the side surface 10A of the functional unit 10 are not perpendicular to the upper surface 20a of the spin-orbit torque wiring 20 (for example, in the case of a shape having a large lower cross-sectional area (a divergent shape)), the shortest distance among distances between side surfaces of the via and side surfaces of the functional unit is set to be the distance $L_{V-M}$.

In the spin-orbit torque wiring 20, a position of $L_{V-M}/2$ corresponds to a position farthest from both of the via 5 and the functional unit 10 and the heat generated around this position is most likely to become trapped. Thus, by positioning the heat sink layer 30 so that the distance T from the spin-orbit torque wiring 20 in the z direction is shorter than both of the via 5 and the functional unit 10, the heat in the place in which the heat is the most likely to become trapped easily dissipates directly to the heat sink layer 30.

It is desirable that a length L of the heat sink layer 30 protruding in the y direction from the side surface 10A of the functional unit 10 (that is, a distance between an end surface 30b of the heat sink layer 30 and the side surface 10A of the functional unit 10 when viewed in a plan view from the z direction) be larger than a thickness T of the functional unit 10.

This is because the length L is a length in which the heat generated in the spin-orbit torque wiring 20 effectively dissipates directly to the heat sink layer 30.

It is desirable that a material of the heat sink layer 30 include at least one selected from the group consisting of Ta, NiCr, Ti, SiN, TiN, ferrite, Ni, and Fe. This is based on the viewpoint of heat dissipation properties and element structure construction.

When ferrite or permalloy which is a soft magnetic material is used as the material of the heat sink layer 30, an effect of blocking an external magnetic field affecting the first ferromagnetic layer 1 and the second ferromagnetic layer 2 in the functional unit 10 (a magnetic shield effect) is also achieved.

It is desirable that a material of a layer (the interlayer insulating layer 6 in the case of FIG. 1) disposed between the heat sink layer 30 and the spin-orbit torque wiring 20 be an oxide or a nitride which contains at least one selected from the group consisting of Si, Ta, Al, Mg, Si, and Ti.

This is because the heat generated in the spin-orbit torque wiring 20 can then be easily transmitted to the heat sink layer 30.

The heat flowing into the heat sink layer 30 mainly dissipates to an electrode 8 and a wiring connected to the electrode 8.

Second Embodiment

Figure 4:
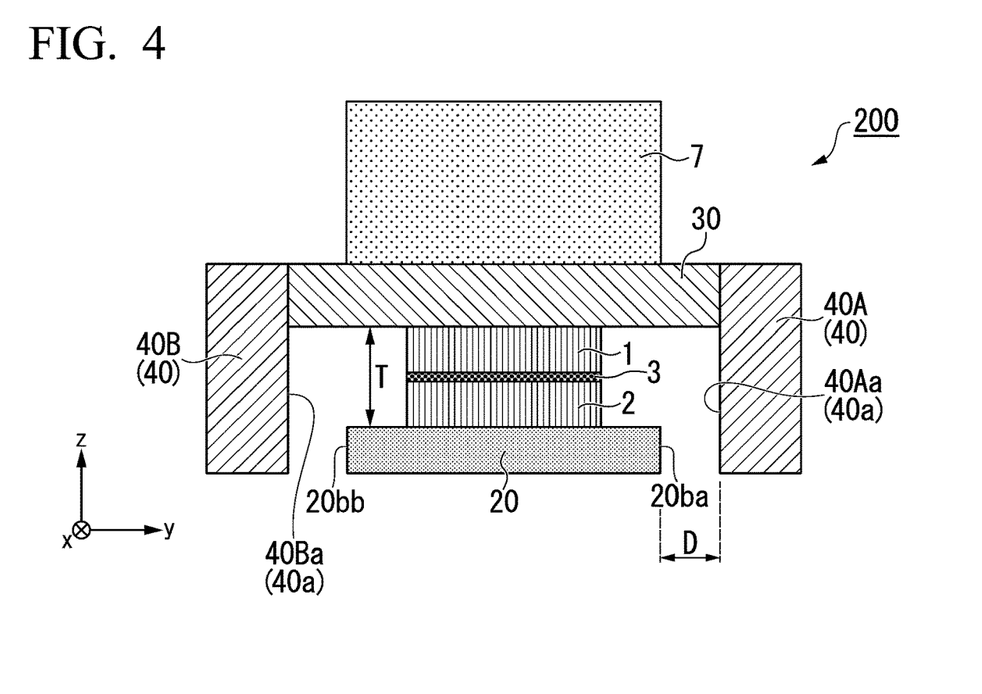
FIG. 4 is a schematic cross-sectional view of an example of a spin-orbit-torque magnetoresistance effect element according to a second embodiment taken along a plane parallel to a yz plane.

FIG. 4 is a schematic cross-sectional view of an example of a spin-orbit-torque magnetoresistance effect element according to a second embodiment taken along a plane parallel to a yz plane.

A spin-orbit-torque magnetoresistance effect element 200 shown in FIG. 4 and the spin-orbit-torque magnetoresistance effect element in the first embodiment differ in that the spin-orbit-torque magnetoresistance effect element 200 extends in a direction (the z direction in the example of FIG. 4) intersecting the x direction which is the first direction, is connected to a heat sink layer, and includes a side heat sink layer disposed so that the spin-orbit-torque magnetoresistance effect element 200 and the spin-orbit torque wiring at least partially overlap when viewed in a plan view from the y direction which is the direction parallel to a plane (an xy plane) orthogonal to the lamination direction.

In the spin-orbit-torque magnetoresistance effect element according to the second embodiment, by providing the heat sink layer (the side heat sink layer) also on a side surface side of the spin-orbit torque wiring, a heat removal effect is improved.

In the following description, description of constituent elements of the spin-orbit-torque magnetoresistance effect element according to the second embodiment that are the same as the spin-orbit-torque magnetoresistance effect element according to the first embodiment will be omitted in some cases.

In the example shown in FIG. 4, in the case of the side heat sink layer 40, (side heat sink layers 40A and 40B) are provided on both sides to have a spin-orbit torque wiring 20 disposed therebetween in the y direction, but one of the side heat sink layers may be configured to be provided only on one side.

In the constitution in which the side heat sink layers are provided on both sides, these side heat sink layers may have the same constitution (material and various dimensions) or a different constitution.

It is desirable that a distance D between the side heat sink layer 40 and the spin-orbit torque wiring 20 in a direction parallel to a plane (an xy plane) orthogonal to a lamination direction thereof (the z direction) be smaller than a distance T between the spin-orbit torque wiring 20 and a heat sink layer 30 in a lamination direction thereof (the z direction).

With this constitution, the heat generated in the spin-orbit torque wiring 20 can easily dissipates via the side heat sink layer 40 without passing through a functional unit 10.

Here, the distance D between the side heat sink layer 40 and the spin-orbit torque wiring 20 in the direction parallel to the plane (the xy plane) orthogonal to the lamination direction thereof (the z direction) refers to a distance between an inner side surface 40a of the side heat sink layer 40 and a side surface 20ba of the spin-orbit torque wiring 20. It should be noted that, when the distance between the inner side surface 40Aa of the side heat sink layer 40A and the side surface 20ba of the spin-orbit torque wiring 20 is different from the distance between an inner side surface 40Ba of the side heat sink layer 40B and a side surface 20bb of the spin-orbit torque wiring 20, it is desirable that both distances be smaller than the distance T.

As described above, in the spin-orbit torque wiring 20, a position of $L_{V-M}/2$ corresponds to a position farthest from both a via 5 and the functional unit 10 and the heat generated around this position is the most easily stagnant (refer to FIG. 1).

For this reason, when the side heat sink layer 40 is disposed so that the side heat sink layer 40 includes the position of $L_{V-M}/2$ in the x direction, a heat removal effect is improved.

As a material of the side heat sink layer 40, the same material as the heat sink layer 30 can be applied.

When ferrite is used as the material of the side heat sink layer 40, an effect of blocking an external magnetic field affecting a first ferromagnetic layer 1 and a second ferromagnetic layer 2 in the functional unit 10 is also achieved.

Third Embodiment

Figure 5:
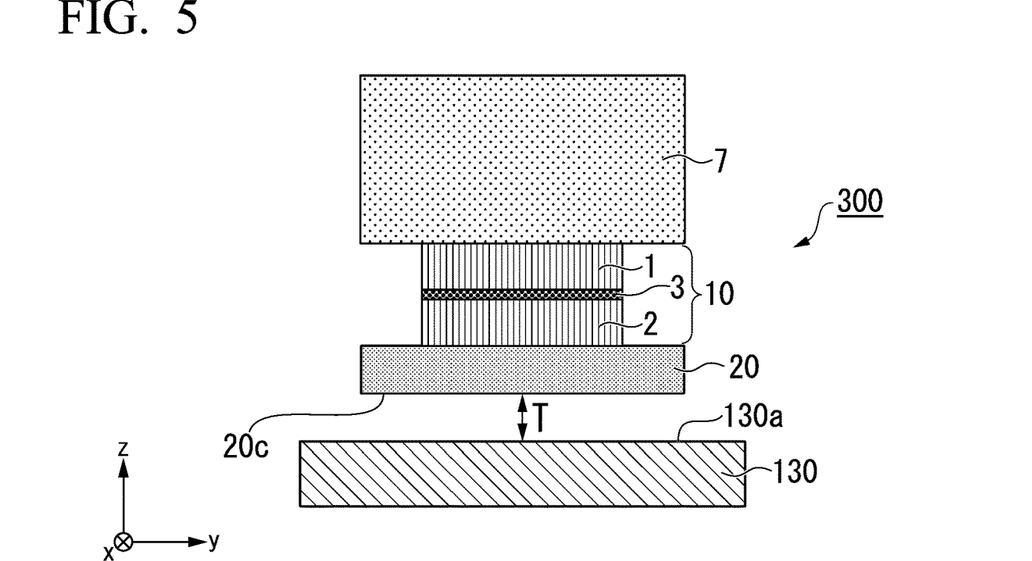
FIG. 5 is a schematic cross-sectional view of an example of a spin-orbit-torque magnetoresistance effect element according to a third embodiment taken along a yz plane.

FIG. 5 is a schematic cross-sectional view of an example of a spin-orbit-torque magnetoresistance effect element according to a third embodiment taken along a yz plane.

A spin-orbit-torque magnetoresistance effect element 300 shown in FIG. 5 and the spin-orbit-torque magnetoresistance effect element in the first embodiment differ in that, in the spin-orbit-torque magnetoresistance effect element 300, a heat sink layer is configured to be disposed on a side opposite to a side at which a functional unit is disposed so that the heat sink layer and the functional unit are disposed to have a spin-orbit torque wiring disposed therebetween.

By providing a constitution so that the heat sink layer is disposed a side at which there is no functional unit 10, as compared with the spin-orbit-torque magnetoresistance effect element in the first embodiment, a degree of freedom in an arrangement position of the heat sink layer increases and the heat sink layer can be disposed close to a spin-orbit torque wiring as long as the flatness in an allowable range can be secured. An example of a standard of a distance in which this approaching is possible is about 30 nm.

In the following description, description of constituent elements of the spin-orbit-torque magnetoresistance effect element according to the third embodiment that are the same as the spin-orbit-torque magnetoresistance effect element according to the first embodiment will be omitted in some cases.

In the case of the spin-orbit-torque magnetoresistance effect element according to the third embodiment, a distance T between the spin-orbit torque wiring and the heat sink layer described above is a distance between a lower surface 20c of a spin-orbit torque wiring 20 and an upper surface 130a of a heat sink layer 130.

Although a via is not shown in FIG. 5, when an in-plane distance orthogonal to a lamination direction (the z direction) of a via connected to the spin-orbit torque wiring 20 and the functional unit 10 is assumed to be $L_{V-M}$, the fact that it is desirable to have a relationship of $T<L_{V-M}/2$ between the distance $L_{V-M}$ and the distance T is the same as in the spin-orbit-torque magnetoresistance effect element in the first embodiment.

Although not shown in FIG. 5, an interlayer insulating layer is provided between the spin-orbit torque wiring 20 and the heat sink layer 130 and the fact that it is desirable that a material of the interlayer insulating layer be an oxide or a nitride which contains at least one selected from the group consisting of Si, Ta, Al, Mg, Si, and Ti is the same as in the above-mentioned interlayer insulating layer 6 (refer to FIG. 1).

Fourth Embodiment

Figure 6:
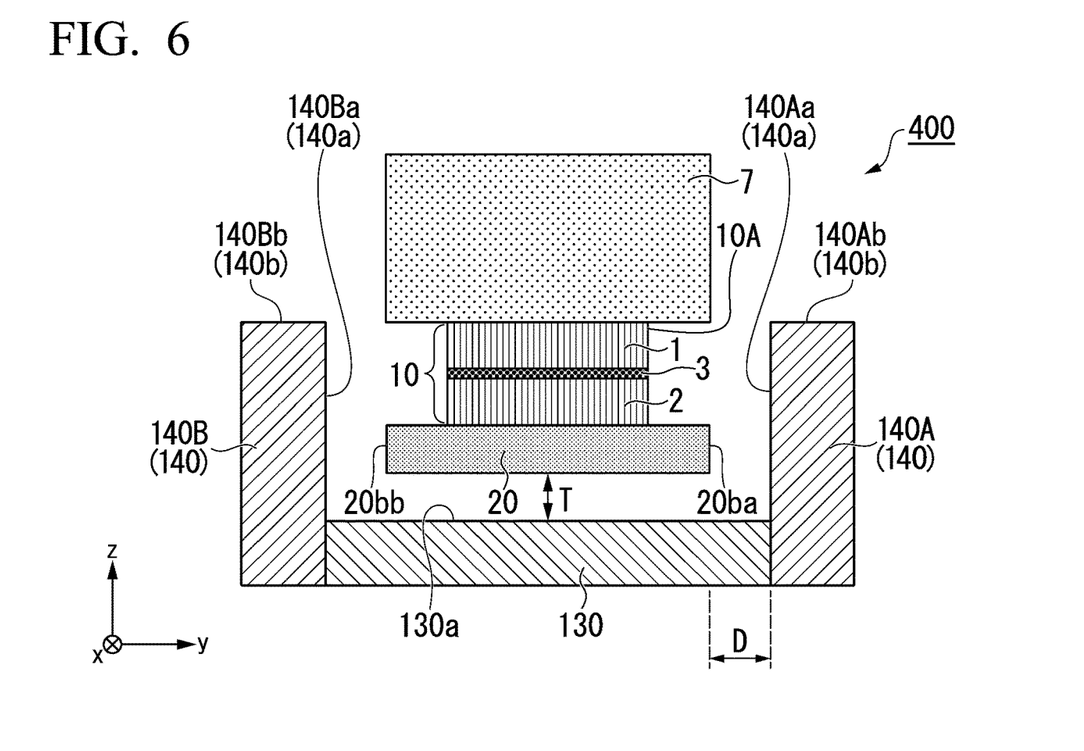
FIG. 6 is a schematic cross-sectional view of an example of a spin-orbit-torque magnetoresistance effect element according to a fourth embodiment taken along a yz plane.
Figure 7:
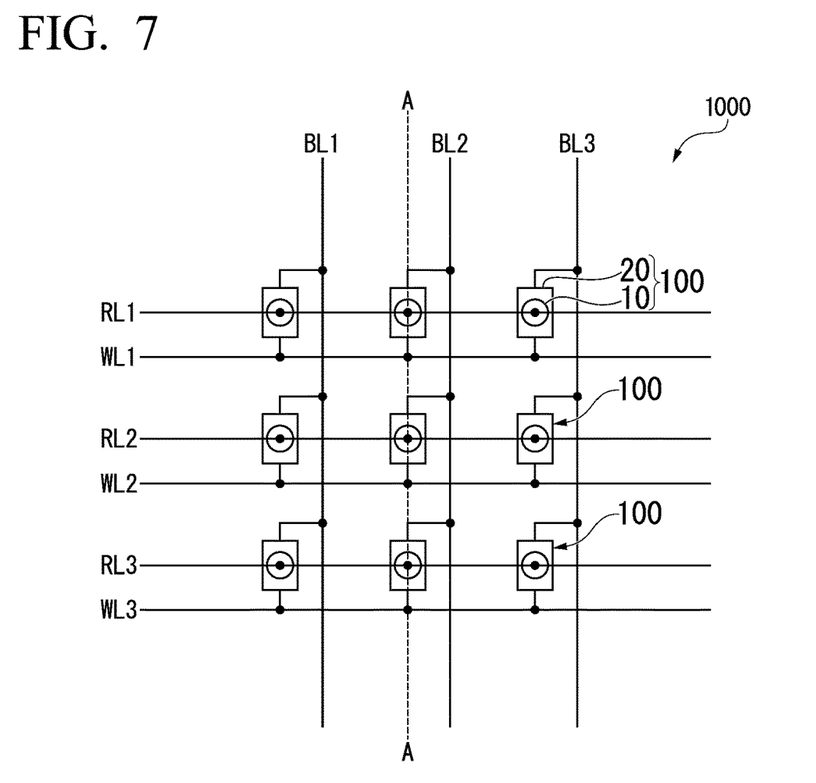
FIG. 7 is a diagram schematically showing a magnetic memory of the present disclosure.

FIG. 6 is a schematic cross-sectional view of an example of a spin-orbit-torque magnetoresistance effect element according to a fourth embodiment taken along a yz plane.

A spin-orbit-torque magnetoresistance effect element 400 shown in FIG. 6 and the spin-orbit-torque magnetoresistance effect element in the third embodiment differ in that the spin-orbit-torque magnetoresistance effect element 400 includes a side heat sink layer 140 (140A and 140B) which extends in a direction (the z direction in the example of FIG. 6) intersecting the x direction which is the first direction, is connected to a heat sink layer 130, and is disposed so that a side heat sink layer 140 and a spin-orbit torque wiring 20 at least partially overlap when viewed in a plan view from the y direction which is a direction parallel to a plane orthogonal to a lamination direction.

In the spin-orbit-torque magnetoresistance effect element according to the fourth embodiment, by providing a heat sink layer (the side heat sink layer) also on a side surface side of the spin-orbit torque wiring, a heat removal effect is improved.

In the following description, description of constituent elements of the spin-orbit-torque magnetoresistance effect element according to the fourth embodiment that are the same as the spin-orbit-torque magnetoresistance effect elements according to the first to third embodiments will be omitted in some cases.

In the example shown in FIG. 6, in the case of the side heat sink layer 140, (side heat sink layers 140A and 140B) are provided on both sides to have the spin-orbit torque wiring 20 disposed therebetween in the y direction, but one of the side heat sink layers may be configured to be provided only on one side.

In the constitution in which the side heat sink layers are provided on both sides, these side heat sink layers may have the same constitution (material and various dimensions) or a different constitution.

It is desirable that a distance D between the side heat sink layer 140 and the spin-orbit torque wiring 20 in a direction parallel to a plane (an xy plane) orthogonal to a lamination direction thereof (the z direction) be smaller than a distance T between the spin-orbit torque wiring 20 and a heat sink layer 130 in a lamination direction thereof (the z direction).

With this constitution, the heat generated in the spin-orbit torque wiring 20 can easily dissipate through the side heat sink layer 40 without passing through a functional unit 10.

Here, the distance D between the side heat sink layer 40 and the spin-orbit torque wiring 20 in the direction parallel to the plane (the xy plane) orthogonal to the lamination direction (the z direction) thereof refers to a distance between an inner side surface 140a of the side heat sink layer 140 and a side surface 20ba of the spin-orbit torque wiring 20. It should be noted that, when the distance between the inner side surface 140Aa of the side heat sink layer 140A and the side surface 20ba of the spin-orbit torque wiring 20 is different from a distance between an inner side surface 140Ba of the side heat sink layer 140B and a side surface 20bb of the spin-orbit torque wiring 20, it is desirable that both distances be smaller than the distance T.

As a material of the side heat sink layer 140, the same material as a heat sink layer 30 can be applied.

When ferrite is used as the material of the side heat sink layer 140, an effect of blocking an external magnetic field affecting a first ferromagnetic layer 1 and a second ferromagnetic layer 2 of the functional unit 10 is also achieved. In order to enhance an effect of blocking an external magnetic field, it is desirable to dispose the side heat sink layer 140 so that the side heat sink layer 140 covers the side surface 10A of the functional unit 10. Particularly, since the second ferromagnetic layer 2 which is a magnetization free layer more sensitively receives an influence of an external magnetic field than the first ferromagnetic layer 1 which is a magnetization fixed layer, it is desirable that the side heat sink layer 140 be disposed to cover at least a side surface of the second ferromagnetic layer 2. That is to say, it is desirable that an upper surface 140b (140Ab and 140Bb) of the side heat sink layer 140 (140A and 140B) be disposed above an interface between the second ferromagnetic layer 2 and the non-magnetic layer 3 in the lamination direction (the z direction) of the functional unit 10.

In the above-described example, as the heat sink layer, a constitution in which one of a heat sink layer (the heat sink layer 30) disposed on the functional unit side of the spin-orbit torque wiring 20 and a heat sink layer (the heat sink layer 130) disposed on an opposite side to a functional unit of the spin-orbit torque wiring 20 in a positional relationship with the spin-orbit torque wiring 20 is provided is shown.

Also, as the side heat sink layer, heat sink layers (the side heat sink layers 140A and 140B) disposed on both sides of a side surface of the spin-orbit torque wiring 20 in a positional relationship with the spin-orbit torque wiring 20 are shown.

As another embodiment, a constitution in which both a heat sink layer (the heat sink layer 30) disposed on the functional unit side of the spin-orbit torque wiring 20 and a heat sink layer (the heat sink layer 130) disposed on an opposite side to the functional unit of the spin-orbit torque wiring 20 are provided may be adopted. In this constitution, a constitution in which a side heat sink layer is not provided, a constitution in which a side heat sink layer is disposed only on one side of the side surface of the spin-orbit torque wiring 20, and a constitution in which side heat sink layers are disposed on both sides of the side surface of the spin-orbit torque wiring 20 may be adopted.

In a constitution in which both a heat sink layer (the heat sink layer 30) disposed on the functional unit side of the spin-orbit torque wiring 20 and a heat sink layer (the heat sink layer 130) disposed on an opposite side to the functional unit of the spin-orbit torque wiring 20 are provided, these side heat sink layers may have the same constitution (material and various dimensions) or a different constitution.

When the spin-orbit-torque magnetoresistance effect element of the present disclosure is used, for example, a substrate or the like may be used as a support. It is desirable that the substrate have excellent flatness, and examples of a material thereof include Si, AlTiC, or the like.

(Magnetic Memory)

A magnetic memory of the present disclosure includes a plurality of magnetoresistance effect elements which are any of the above-mentioned magnetoresistance effect elements.

The magnetic memory of the present disclosure can have known constituent elements as constituent elements other than a magnetoresistance effect element.

FIG. 8 is a plan view of a magnetic memory 1000 which includes a plurality of spin-orbit-torque magnetoresistance effect elements 100 (refer to FIG. 1). In the magnetic memory 1000 shown in FIG. 8, the spin-orbit-torque magnetoresistance effect elements 100 are arranged in a 3×3 matrix. FIG. 8 is an example of the magnetic memory and the number and arrangement of spin-orbit-torque magnetoresistance effect elements 100 are arbitrary.

One of word lines WL1 to WL3, one of bit lines BL1 to BL3, and one of read lines RL1 to RL3 are connected to each of the spin-orbit-torque magnetoresistance effect elements 100.

A writing operation is performed by selecting one of the word lines WL1 to WL3 and one of the bit lines BL1 to BL3 to which a current is applied and flowing the current through a spin-orbit torque wiring 20 of any of the spin-orbit-torque magnetoresistance effect elements 100. Furthermore, a reading operation is performed by selecting one of the read lines RL1 to RL3 and one of the bit lines BL1 to BL3 to which a current is applied and flowing the current through any of the spin-orbit-torque magnetoresistance effect elements 100 in a lamination direction thereof. One of the word lines WL1 to WL3, one of the bit lines BL1 to BL3, and one of the read lines RL1 to RL3 to which a current is applied can be selected using a transistor or the like. That is to say, the present disclosure can be used as a magnetic memory when data of any element is read from the plurality of spin-orbit-torque magnetoresistance effect elements 100.

(Method for Producing Spin-Orbit-Torque Magnetoresistance Effect Element)

All of the above-mentioned spin-orbit-torque magnetoresistance effect elements can be produced using a known technology and production examples will be shown below.

Production Example 1

An example of a method for producing a spin-orbit-torque magnetoresistance effect element 100 will be described with reference to FIG. 2.

First, a laminated film is formed by laminating a film used for forming a spin-orbit torque wiring 20, a film used for forming a second ferromagnetic layer 2, a film used for forming a non-magnetic layer 3, and a film used for forming a first ferromagnetic layer 1 in order from the spin-orbit torque wiring 20 side. A known method such as a sputtering method, a chemical vapor deposition (CVD) method, and the like can be used as a method for laminating each layer.

Subsequently, unnecessary portions of the laminated film are removed using a technique such as photolithography and the spin-orbit torque wiring 20, the second ferromagnetic layer 2, the non-magnetic layer 3, and the first ferromagnetic layer 1 are subjected to processes.

Subsequently, planarization is performed using chemical mechanical polishing (CMP) and the first ferromagnetic layer 1 is exposed to form a functional unit 10.

After that, a film used for forming an interlayer insulating layer 6 is laminated to cover the processed laminate.

Subsequently, the spin-orbit-torque magnetoresistance effect elements 100 can be produced by opening a hole for forming a heat sink layer 30 using a technique such as photolithography and performing filling of the heat sink layer 30.

In the example shown in FIG. 2, after that, an electrode 7 is formed. The electrode 7 can be prepared using any known technique.

Production Example 2

An example of a method for producing a spin-orbit-torque magnetoresistance effect element 400 will be described with reference to FIG. 6.

First, a laminated film is formed by laminating a film used for forming a heat sink layer 130, a film used for forming an interlayer insulating film (not shown), a film used for forming a spin-orbit torque wiring 20, a film used for forming a second ferromagnetic layer 2, a film used for forming a non-magnetic layer 3, and a film used for forming a first ferromagnetic layer 1 in order from the heat sink layer 130 side. A known method such as a sputtering method, a chemical vapor deposition (CVD) method, and the like can be used as a method for laminating each layer.

Subsequently, unnecessary portions of the laminated film are removed using a technique such as photolithography and the heat sink layer 130, the interlayer insulating film (not shown), the spin-orbit torque wiring 20, the second ferromagnetic layer 2, the non-magnetic layer 3, and the first ferromagnetic layer 1 are subjected to processes.

After that, a film used for forming an interlayer insulating layer (not shown) is laminated to cover the processed laminate.

Subsequently, a hole for forming a side heat sink layer 140 using a technique such as photolithography is opened and filling of the side heat sink layer 140 is performed.

Subsequently, a functional unit 10 can be formed by performing planarization using CMP and exposing the first ferromagnetic layer 1 and the spin-orbit-torque magnetoresistance effect element 400 can be produced.

In the example shown in FIG. 6, after that, an electrode 7 is formed. The electrode 7 can be prepared using any known technique.

Although the preferred embodiments of the present disclosure have been described above in detail, the present disclosure is not limited to the specific embodiments, and various modifications and changes are possible without departing from the gist of the present disclosure described in the scope of the claims.

According to the spin-orbit-torque magnetoresistance effect element of the present disclosure, it is possible to provide a spin-orbit-torque magnetoresistance effect element in which dissipation of the heat generated in a spin-orbit torque wiring is improved.

While preferred embodiments of the disclosure have been described and shown above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

EXPLANATION OF REFERENCES

1 First ferromagnetic layer
2 Second ferromagnetic layer
3 Non-magnetic layer
5, 5A, 5B Via
10 Functional unit
20 Spin-orbit torque wiring
30, 30A, 30B, 130, 130A, 130B Heat sink layer
40, 40A, 40B, 140, 140A, 140B Side heat sink layer

What is claimed is:

1. A spin-orbit-torque magnetoresistance effect element comprising:
   a functional unit having laminated therein:
      a first ferromagnetic layer whose magnetization direction is configured to be fixed;
      a second ferromagnetic layer whose magnetization direction is configured to change; and
      a non-magnetic layer located between the first ferromagnetic layer and the second ferromagnetic layer;
   a spin-orbit torque wiring which extends in a first direction which intersects a lamination direction of the functional unit and is joined to the second ferromagnetic layer; and
   a heat sink layer which extends in the first direction, is disposed so that the heat sink layer and the spin-orbit torque wiring at least partially overlap when viewed in a plan view from the lamination direction, and is spaced from the spin-orbit torque wiring in the lamination direction by a distance of twice a thickness of the functional unit or less in the lamination direction,
   wherein a relationship of $T < L_{V-M}/2$ is satisfied between T and $L_{V-M}$, T being a distance between the spin-orbit torque wiring and the heat sink layer in the lamination direction and $L_{V-M}$ being an in-plane distance between a via connected to the spin-orbit torque wiring and the functional unit orthogonal to the lamination direction.

2. The spin-orbit-torque magnetoresistance effect element according to claim 1, wherein the heat sink layer is joined to a surface of the first ferromagnetic layer opposite to a surface thereof joined to the non-magnetic layer.

3. The spin-orbit-torque magnetoresistance effect element according to claim 2, wherein the heat sink layer is disposed on an opposite side to a side at which the functional unit is disposed with the spin-orbit torque wiring disposed therebetween.

4. The spin-orbit-torque magnetoresistance effect element according to claim 1, wherein the heat sink layer is disposed on an opposite side to a side at which the functional unit is disposed with the spin-orbit torque wiring disposed therebetween.

5. The spin-orbit-torque magnetoresistance effect element according to claim 1, further comprising a side heat sink layer which extends in the lamination direction, is connected to the heat sink layer, and is disposed so that the side heat sink layer and the spin-orbit torque wiring at least partially overlap when viewed in a plan view from a direction parallel to a surface orthogonal to the lamination direction.

6. The spin-orbit-torque magnetoresistance effect element according to claim 5, wherein a distance between the side heat sink layer and the spin-orbit torque wiring in a direction parallel to a surface orthogonal to the lamination direction is smaller than a distance between the spin-orbit torque wiring and the heat sink layer in the lamination direction.

7. The spin-orbit-torque magnetoresistance effect element according to claim 5, wherein a material of the side heat sink layer contains at least one selected from the group consisting of Ta, NiCr, Ti, SiN, TiN, ferrite, Ni, and Fe.

8. The spin-orbit-torque magnetoresistance effect element according to claim 5, wherein a material of a layer disposed between the side heat sink layer and the spin-orbit torque wiring is an oxide or a nitride which contains at least one selected from the group consisting of Si, Ta, Al, Mg, Si, and Ti.

9. The spin-orbit-torque magnetoresistance effect element according to claim 1, wherein a material of the heat sink layer contains at least one selected from the group consisting of Ta, NiCr, Ti, SiN, TiN, ferrite, Ni, and Fe.

10. The spin-orbit-torque magnetoresistance effect element according to claim 1, wherein a material of a layer disposed between the heat sink layer and the spin-orbit torque wiring is an oxide or a nitride which contains at least one selected from the group consisting of Si, Ta, Al, Mg, Si, and Ti.

11. A magnetic memory, comprising a plurality of the spin-orbit-torque magnetoresistance effect elements according to claim 1.

* * * * *